United States Patent
Hata

(10) Patent No.: US 8,022,430 B2
(45) Date of Patent: Sep. 20, 2011

(54) NITRIDE-BASED COMPOUND SEMICONDUCTOR LIGHT-EMITTING DEVICE

(75) Inventor: Toshio Hata, Mihara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 10/897,548

(22) Filed: Jul. 23, 2004

(65) Prior Publication Data

US 2005/0017253 A1  Jan. 27, 2005

(30) Foreign Application Priority Data

Jul. 25, 2003 (JP) .................................. 2003-201853
Jul. 8, 2004 (JP) .................................. 2004-201718

(51) Int. Cl.
  *H01L 33/00* (2010.01)
(52) U.S. Cl. ...................... 257/99; 257/91; 257/E33.063
(58) Field of Classification Search ................... 257/91, 257/99, E33.063
See application file for complete search history.

(56) References Cited

U.S. PATENT DOCUMENTS

| | | | | |
|---|---|---|---|---|
| 6,146,916 A * | 11/2000 | Nanishi et al. | ................... | 438/46 |
| 6,255,129 B1 * | 7/2001 | Lin | ................... | 438/26 |
| 2002/0105268 A1 * | 8/2002 | Schliep et al. | ................. | 313/512 |
| 2002/0113235 A1 * | 8/2002 | Udagawa | ........................ | 257/59 |
| 2002/0117677 A1 | 8/2002 | Okuyama et al. | | |
| 2003/0045015 A1 * | 3/2003 | Slater et al. | ...................... | 438/26 |
| 2003/0102484 A1 * | 6/2003 | Hata et al. | ........................ | 257/99 |
| 2004/0245543 A1 * | 12/2004 | Yoo | ................................ | 257/103 |
| 2005/0029533 A1 * | 2/2005 | Wu et al. | .......................... | 257/99 |

FOREIGN PATENT DOCUMENTS

| | | |
|---|---|---|
| JP | 09-8403 | 1/1997 |
| JP | 10215029 | * 11/1998 |
| JP | 11-177142 | 7/1999 |
| JP | 11-317546 | 11/1999 |
| JP | 2000-277804 | 10/2000 |
| JP | 2001-085750 A | 3/2001 |
| JP | 2001-217456 | * 10/2001 |
| JP | 2002-100805 | 4/2002 |
| JP | 2003-158296 | 5/2003 |
| JP | 2003-174193 | 6/2003 |
| WO | WO-03/038874 A1 | 5/2003 |

OTHER PUBLICATIONS

Pelto et al. "Issue concerning the preparation of ohmic contacts to n-GaN," Solid State Electronics vol. 45, p. 1597-1605, 2001.*

* cited by examiner

*Primary Examiner* — Matthew Reames
(74) *Attorney, Agent, or Firm* — Morrison & Foerster LLP

(57) ABSTRACT

A nitride-based compound semiconductor light-emitting device comprising a holding electrode partially formed on a first main surface of a semiconductor laminate including nitride-based compound semiconductor layers including at an emission layer. A method of fabricating a nitride-based compound semiconductor light-emitting device, comprising steps of forming a semiconductor laminate by stacking nitride-based compound semiconductor layers at least partially on a substrate to include an emission layer, forming a holding electrode partially on a main surface of the semiconductor laminate located oppositely to the substrate and removing the substrate. Thus, a nitride-based compound semiconductor light-emitting device having high external luminous efficiency with no wafer breakage or cracking and a method of fabricating the same can be proposed.

11 Claims, 15 Drawing Sheets

ND-BASED COMPOUND SEMICONDUCTOR LIGHT-EMITTING DEVICE

This nonprovisional application is based on Japanese Patent Applications Nos. 2003-201853 and 2004-201718 filed with the Japan Patent Office on Jul. 25, 2003 and Jul. 8, 2004, respectively, the entire contents of which are hereby incorporated by reference.

BACKGROUND OF THE INVENTION

1. Field of the Invention

The present invention relates to a nitride-based compound semiconductor light-emitting device (light-emitting diode or the like, for example) capable of emitting light in the blue region to the ultraviolet region and a method of fabricating the same. More particularly, the present invention relates to an electrode structure of a nitride-based compound semiconductor light-emitting device from which a substrate is removed and a method of fabricating the same.

2. Description of the Background Art

A nitride-based compound semiconductor light-emitting device having a structure allowing extraction of electrodes from upper and lower portions and a method of fabricating the same are proposed in general (refer to Japanese Patent Laying-Open No. 2000-277804). As shown in FIG. 21, the nitride-based compound semiconductor light-emitting device disclosed in Japanese Patent Laying-Open No. 2000-277804 is obtained by bonding a conductive substrate 205 to a wafer of a semiconductor laminate 210 of nitride-based compound semiconductor layers formed by successively growing an n-type layer 200, an emission layer 201 and a p-type layer 202 on an insulating substrate and thereafter partially or entirely removing the insulating substrate from the wafer thereby exposing the semiconductor laminate 210 of the nitride-based compound semiconductor layers, while a negative electrode 206 and a positive electrode 207 are provided on the exposed semiconductor laminate 210 and the conductive substrate 205 as opposite electrodes respectively.

In the aforementioned conventional nitride-based compound semiconductor light-emitting device, however, a metal holding substrate is formed on the overall surface of the wafer to disadvantageously strain the semiconductor laminate 210 and break or crack the wafer, leading to reduction of the yield or reliability of the nitride-based compound semiconductor light-emitting device.

Further, the main surface of the p-type layer 202 forming the lower portion of the semiconductor laminate 210 and those of the conductive substrate 205 serving as a p-side holding electrode and the positive electrode 207 are identical to each other and hence the conductive substrate 205 and/or the positive electrode 207 disadvantageously blocks outwardly emitted light to reduce external luminous efficiency. In addition, the conductive substrate 205 and/or the positive electrode 207 formed by a metal layer disadvantageously reduces the outwardly emitted light, to result in deterioration of the external luminous efficiency of the nitride-based compound semiconductor light-emitting device.

Further, the n-type layer 200 may be also strained due to the negative electrode 206 directly formed thereon, to disadvantageously break or crack the wafer.

SUMMARY OF THE INVENTION

An object of the present invention is to provide a nitride-based compound semiconductor light-emitting device having high external luminous efficiency with no wafer breakage or cracking and a method of fabricating the same.

In order to attain the aforementioned object, a nitride-based compound semiconductor light-emitting device according to an aspect of the present invention comprises a holding electrode partially formed on a first main surface of a semiconductor laminate including nitride-based compound semiconductor layers including an emission layer.

A method of fabricating a nitride-based compound semiconductor light-emitting device according to another aspect of the present invention comprises steps of forming a semiconductor laminate by stacking nitride-based compound semiconductor layers at least partially on a substrate to include an emission layer, forming a holding electrode partially on a main surface of the semiconductor laminate located oppositely to the substrate and removing the substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
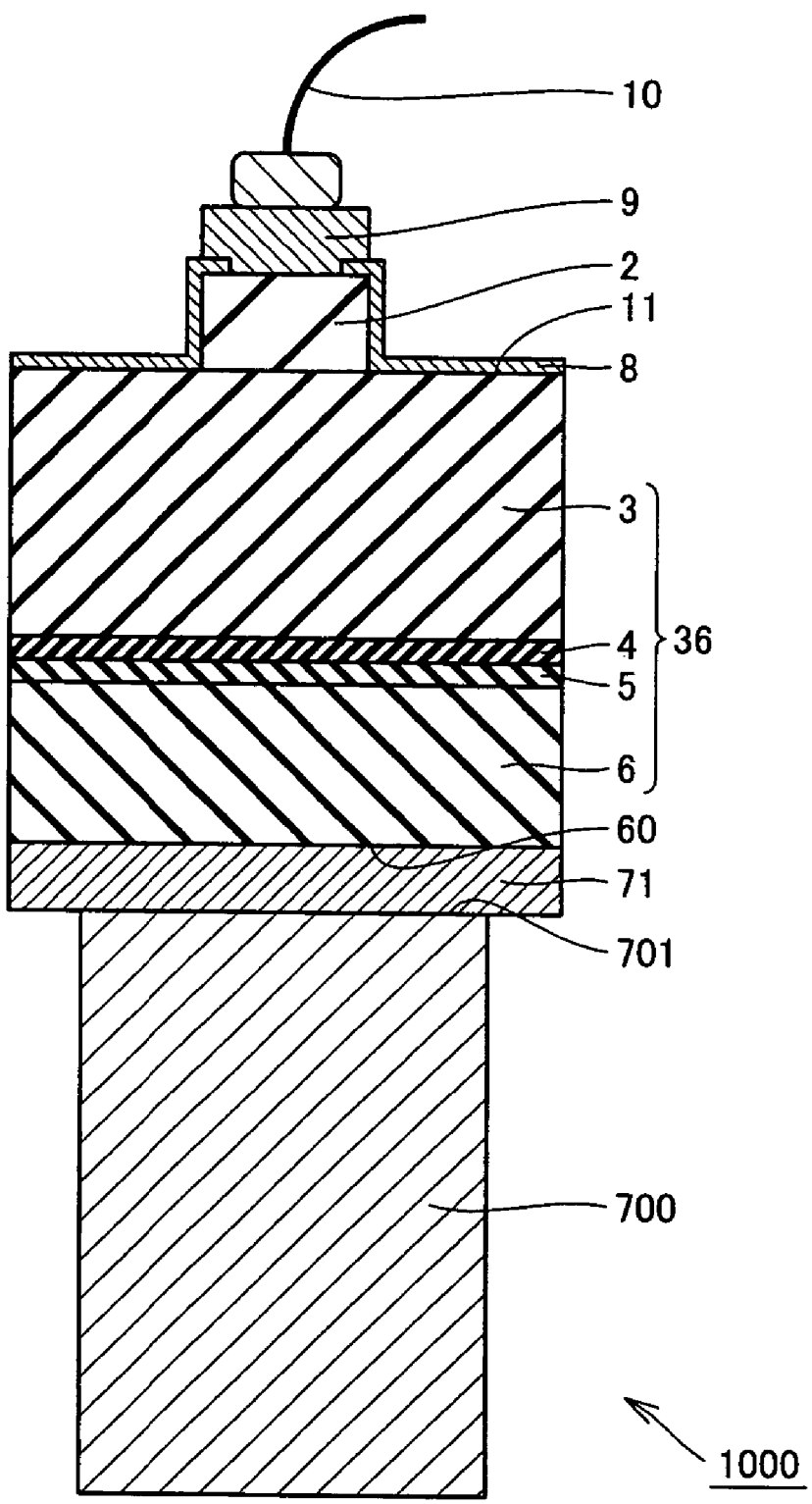
FIG. 1 is a schematic sectional view of a nitride-based compound semiconductor light-emitting device according to a first embodiment of the present invention.

In a nitride-based compound semiconductor light-emitting device according to the present invention, a holding electrode 700 is partially formed on a first main surface 60 of a semiconductor laminate 36 including nitride-based compound semiconductor layers including an emission layer 4, as shown in FIG. 1. In this nitride-based compound semiconductor light-emitting device, the holding electrode 700 is partially formed on the first main surface 60 of the semiconductor laminate 36 for reducing strain caused on the semiconductor laminate 36, so that a wafer can be inhibited from breakage or cracking. In other words, the semiconductor laminate 36 is improved in mechanical strength, to simplify formation of upper and lower electrodes. Further, the holding electrode 700 does not cover the emission layer 4 of the semiconductor laminate 36, whereby the nitride-based compound semiconductor light-emitting device exhibits excellent external luminous efficiency.

In the nitride-based compound semiconductor light-emitting device according to the present invention, the emission layer 4 of the semiconductor laminate 36 can be located on a position of the semiconductor laminate 36 apart from a main surface 701 of the holding electrode 700 facing the semiconductor laminate 36. In this case, the holding electrode 700 does not intercept light emitted from the emission layer 4, whereby the nitride-based compound semiconductor light-emitting device is improved in external luminous efficiency.

In the nitride-based compound semiconductor light-emitting device according to the present invention, the area of the main surface 701 of the holding electrode 700 can be rendered smaller than that of the first main surface 60 of the semiconductor laminate 36. The holding electrode 700 slightly intercepts the light emitted from the emission layer 4, whereby the nitride-based compound semiconductor light-emitting device is improved in external luminous efficiency.

In the nitride-based compound semiconductor light-emitting device according to the present invention, the holding electrode 700 can include one metal selected from a group consisting of Ni, Cu, Ag, Au, Pd and Al or a laminate of these metals. Thus, the holding electrode 700 is improved in ohmic property with respect to the nitride-based compound semiconductor layers forming the semiconductor laminate 36. Further, the holding electrode 700 is improved in reflectance for the light emitted from the emission layer 4 of the semiconductor laminate 36.

In the nitride-based compound semiconductor light-emitting device according to the present invention, the holding electrode 700 can be formed by vapor deposition, plating or vapor deposition and plating. When vapor deposition or plating is employed, a large number of holding electrodes 700 can be formed in a short time. The plating method is not particularly restricted but any method such as electrolytic plating or electroless plating is employable.

In the nitride-based compound semiconductor light-emitting device according to the present invention, the holding electrode 700 formed by vapor deposition can be formed of a transparent conductor. When the holding electrode 700 is formed of a transparent conductor, absorption of the light emitted from the emission layer 4 is so reduced that a double electrode can be implemented. The transparent conductor can include at least one metal oxide selected from a group consisting of Sn-added indium oxide ($In_2O_3$:Sn), tin oxide ($SnO_2$), Sb-added tin oxide ($SnO_2$:Sb), F-added tin oxide ($SnO_2$:F), Al-added zinc oxide (ZnO:Al) and Ga-added zinc oxide (ZnO:Ga). The content of each additional element in each additional compound is preferably 5 mole % to 10 mole %. The transparent conductor is reduced in conductivity if the content of each additional element is less than 5 mole % although the same exhibits small light absorption in this case, while the transparent conductor is increased in light absorption if the content exceeds 10 mole % although the same exhibits high conductivity in this case.

In the nitride-based compound semiconductor light-emitting device according to the present invention, the holding electrode 700 formed by vapor deposition, plating or vapor deposition and plating can be formed through a resin photomask. When the resin photomask is employed for forming the holding electrode 700, a photoetching step is so enabled that the holding electrode 700 can be readily partially formed on any nitride-based compound semiconductor layer.

Figure 9:
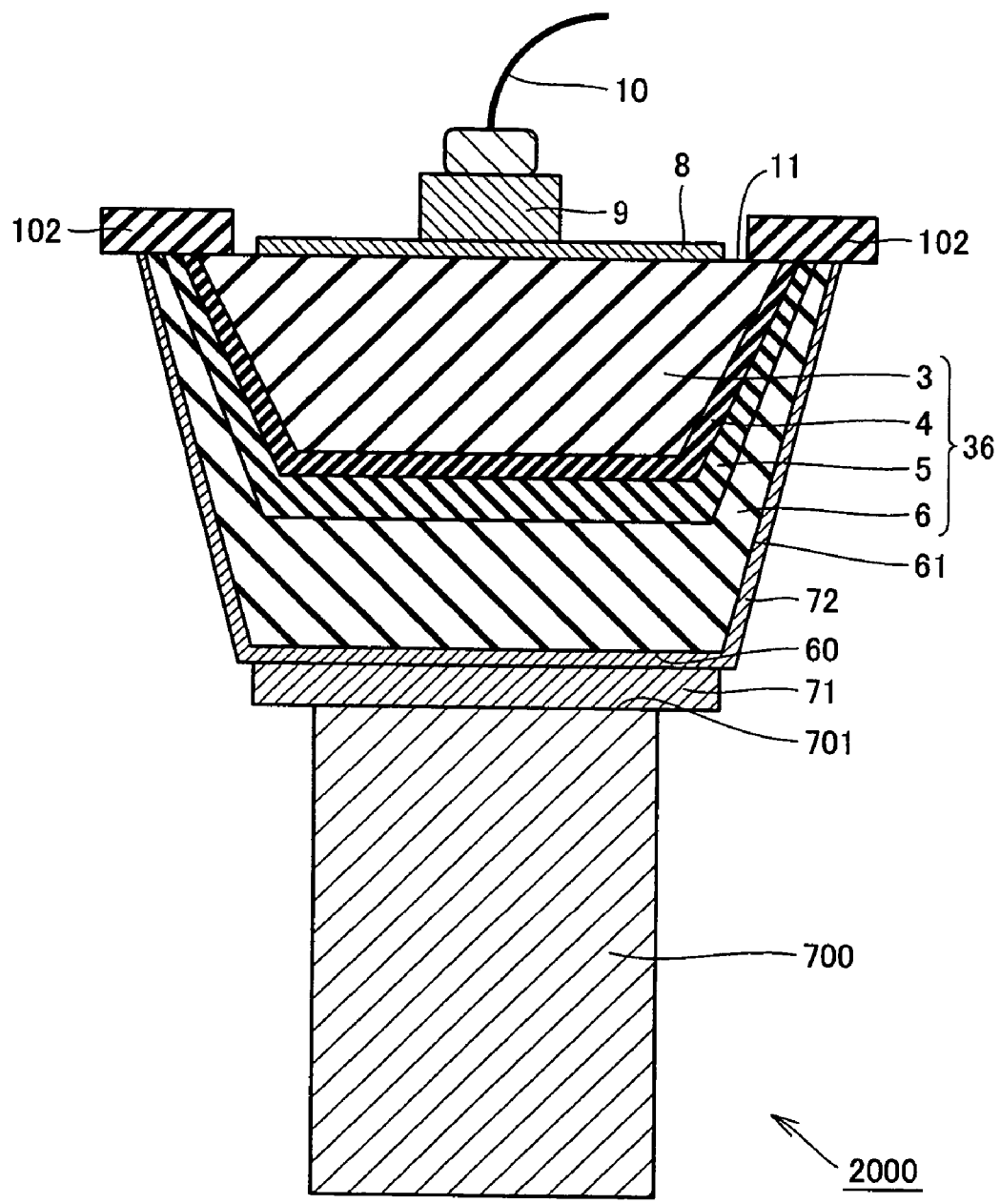
FIG. 9 is a schematic sectional view of a nitride-based compound semiconductor light-emitting device according to a second embodiment of the present invention.

In another nitride-based compound semiconductor light-emitting device according to the present invention, at least an emission layer 4 can be formed in a bent manner in a semiconductor laminate 36 including nitride-based compound semiconductor layers including an emission layer 4, as shown in FIG. 9. In this case, light is emitted from side surfaces 61 of the semiconductor laminate 36 in an unintercepted state due to the bent emission layer 4, whereby the nitride-based compound semiconductor light-emitting device is improved in external luminous efficiency.

In this nitride-based compound semiconductor light-emitting device according to the present invention, the bent emission layer 4 of the semiconductor laminate 36 can be located on a position of the semiconductor laminate 36 apart from a main surface 701 of a holding electrode 700 facing the semiconductor laminate 36. In this case, the holding electrode 700 does not intercept light emitted from the emission layer 4, whereby the nitride-based compound semiconductor light-emitting device is improved in external luminous efficiency.

In this nitride-based compound semiconductor light-emitting device according to the present invention, the thickness of the holding electrode 700 can be set to 10 μm to 300 μm. If the thickness of the holding electrode 700 is less than 10 μm, it is difficult to perform plating at a regular height, and a chip is hard to handle. If the thickness of the holding electrode 700 exceeds 300 μm, on the other hand, it is difficult to perform plating at a regular height due to difficulty in formation of the resin photomask having a thickness exceeding 300 μm. If the height of the chip is increased, further, the chip may be mechanically broken during handling. In consideration of these points, the thickness of the holding electrode 700 is more preferably set to 70 μm to 100 μm.

Figure 18:
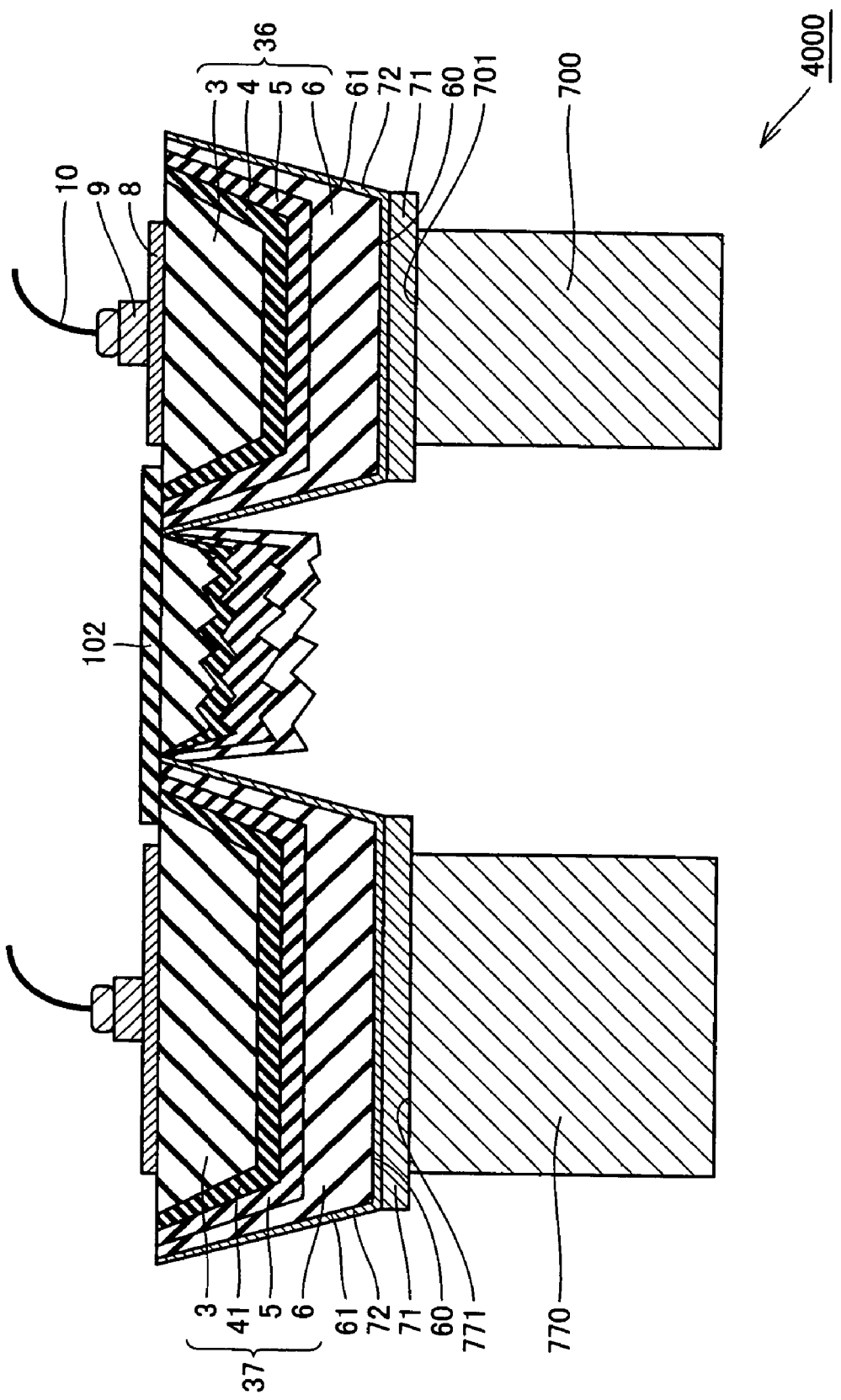
FIG. 18 is a schematic sectional view of a nitride-based compound semiconductor light-emitting device according to a fourth embodiment of the present invention.

Still another nitride-based compound semiconductor light-emitting device according to the present invention has at least two semiconductor laminates 36, 37, each of which includes nitride-based compound semiconductor layers including an emission layer 4, 41 and a holding electrode 700, 770 partially formed on first main surfaces of the semiconductor laminate 36, 37 as shown in FIG. 18, and the emission layers 4, 41 of the semiconductor laminates 36, 37 are different in emission area from each other. The term "emission area" of an emission layer stands for the area of a light-emitting surface of the emission layer, in correspondence to the area of the main surface in a planar emission layer or the areas of the main surface and the side surfaces resulting from bending in a bent emission layer.

Referring to FIG. 18, this nitride-based compound semiconductor light-emitting device according to the present invention has at least two semiconductor laminates 36, 37, each of which includes nitride-based compound semiconductor layers including an emission layer 4, 41 and a holding electrode 700, 770 partially formed on the first main surfaces of the semiconductor laminate 36, 37 and the emission layers 4, 41 of the semiconductor laminates 36, 37 are different in emission wavelength from each other.

Figure 19:
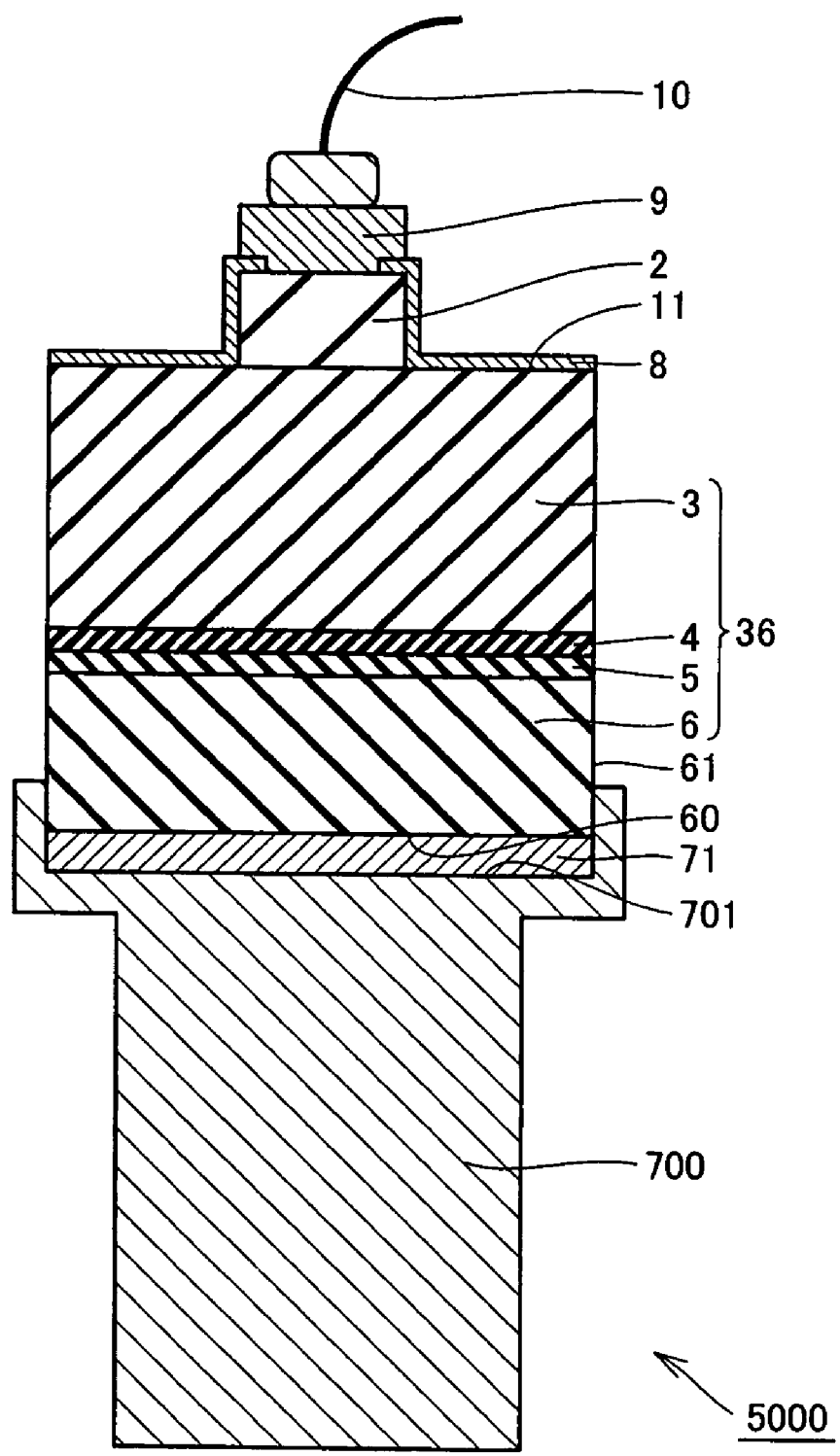
FIG. 19 is a schematic sectional view of a nitride-based compound semiconductor light-emitting device according to a fifth embodiment of the present invention.
Figure 20:
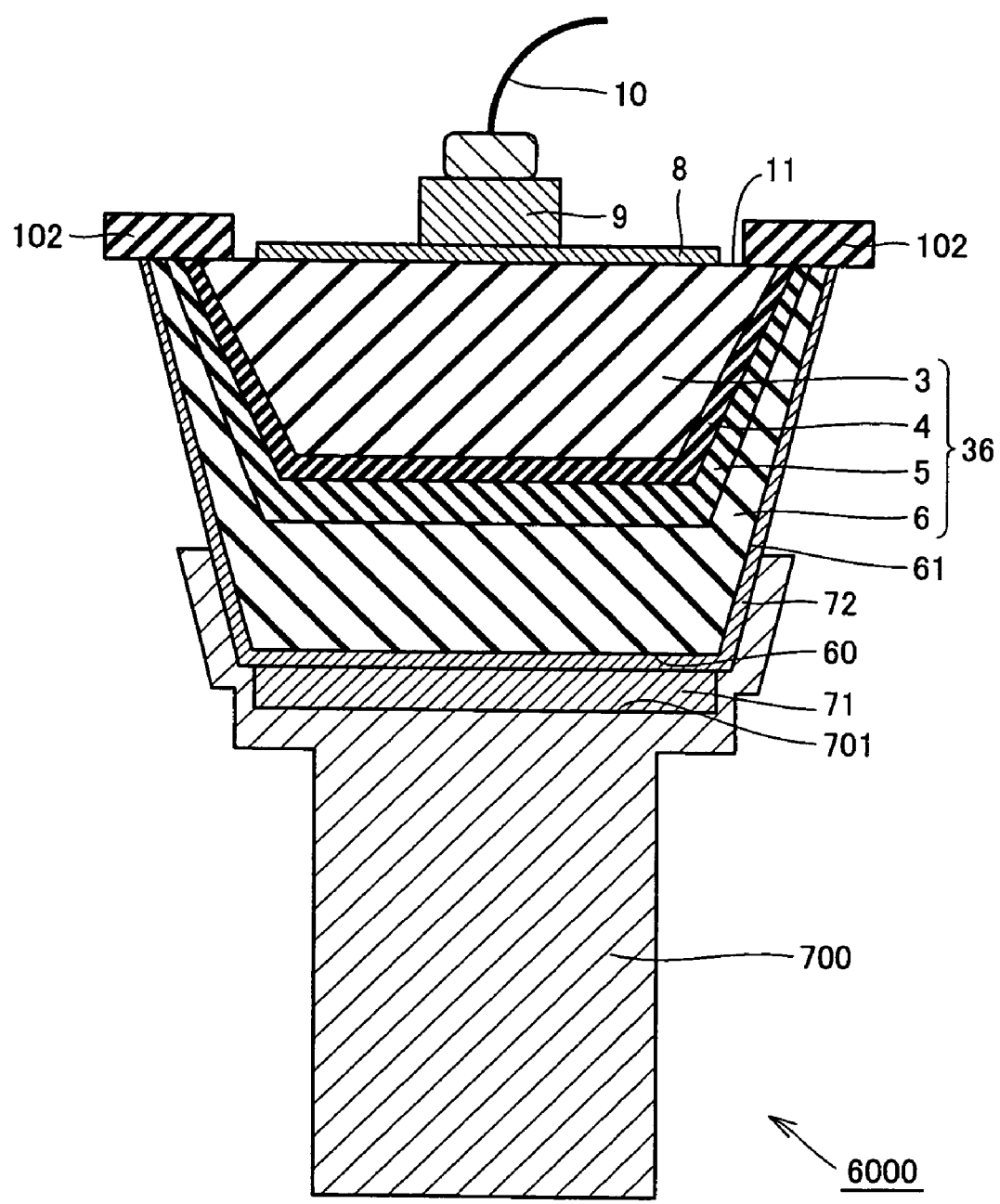
FIG. 20 is a schematic sectional view of a nitride-based compound semiconductor light-emitting device according to a sixth embodiment of the present invention.
Figure 21:
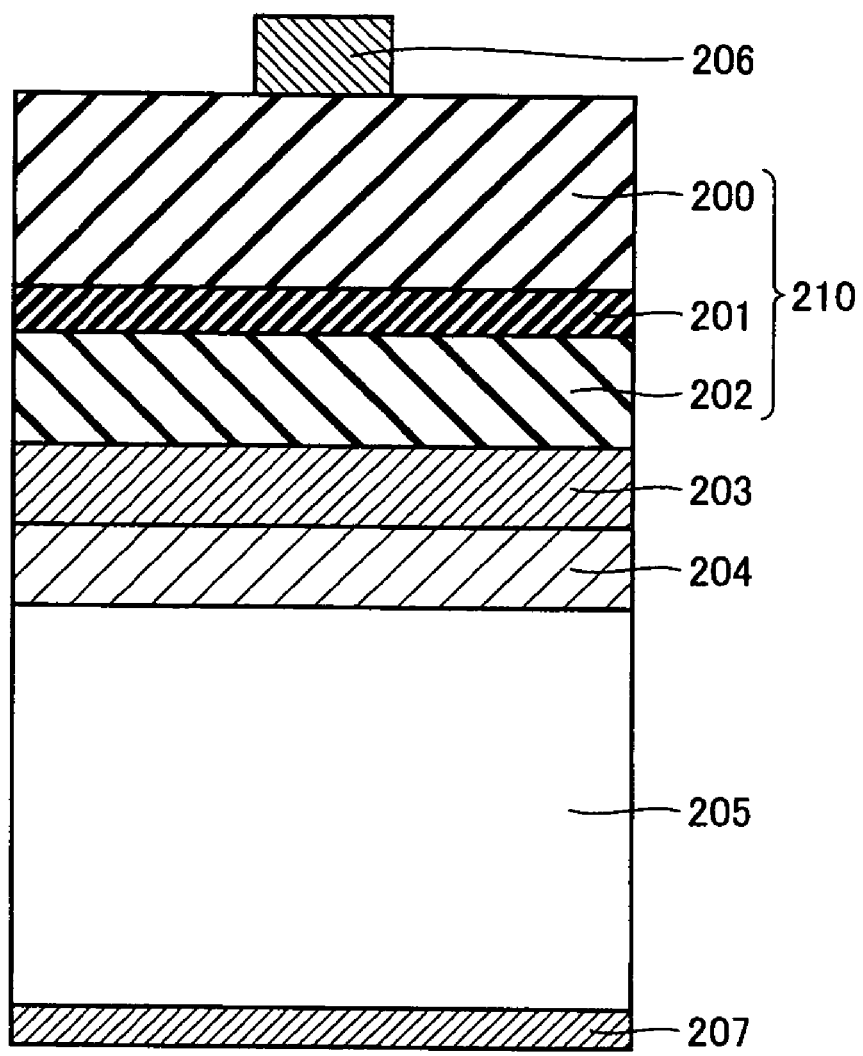
FIG. 21 is a schematic sectional view of a conventional nitride-based compound semiconductor light-emitting device.

In a further nitride-based compound semiconductor light-emitting device according to the present invention, a holding electrode 700 is formed partially on side surfaces 61 of a semiconductor laminate 36 including nitride-based compound semiconductor layers including an emission layer 4 and on a first main surface 60 of the semiconductor laminate 36, as shown in FIGS. 19 and 20. In this case, the semiconductor laminate 36 and the holding electrode 700 are improved in mechanical strength. While the holding electrode 700 partially formed on the side surfaces 61 of the semiconductor laminate 36 slightly intercepts light emitted from the emission layer 4, the degree of this interception can be reduced by preparing the holding electrode 700 from the aforementioned transparent conductor.

Figure 2:
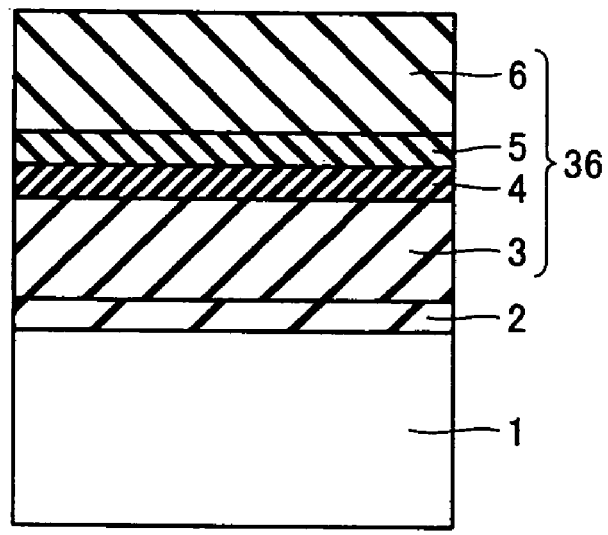
FIGS. 2 to 8 illustrate steps of fabricating the nitride-based compound semiconductor light-emitting device according to the first embodiment of the present invention.
Figure 3:
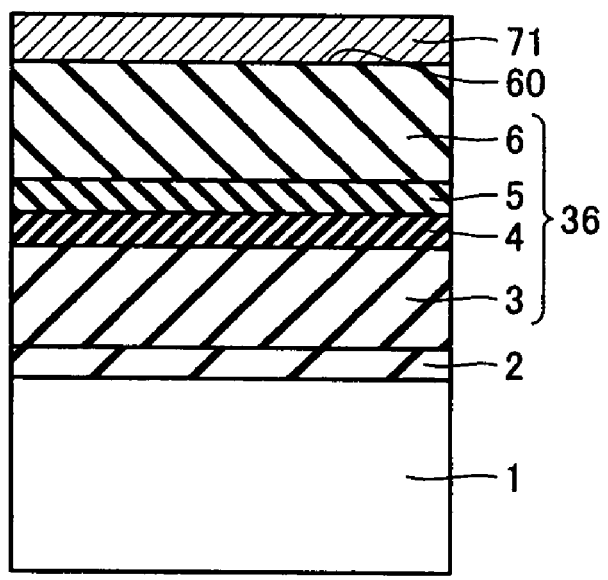
Figure 4:
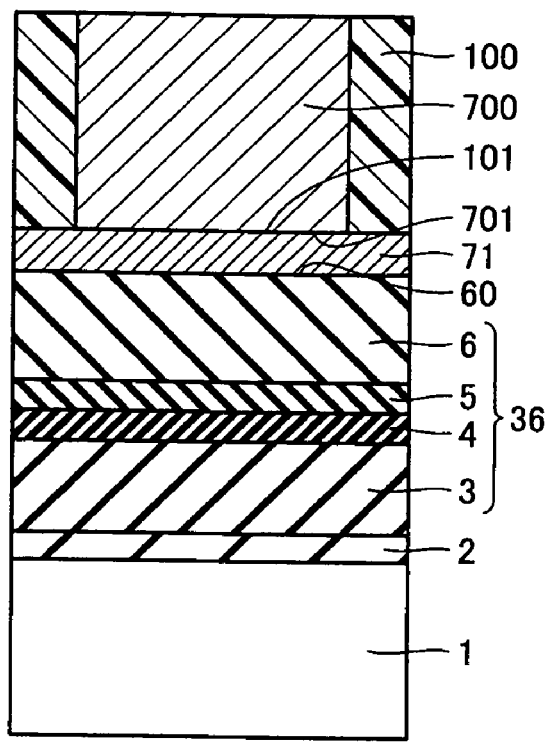
Figure 5:
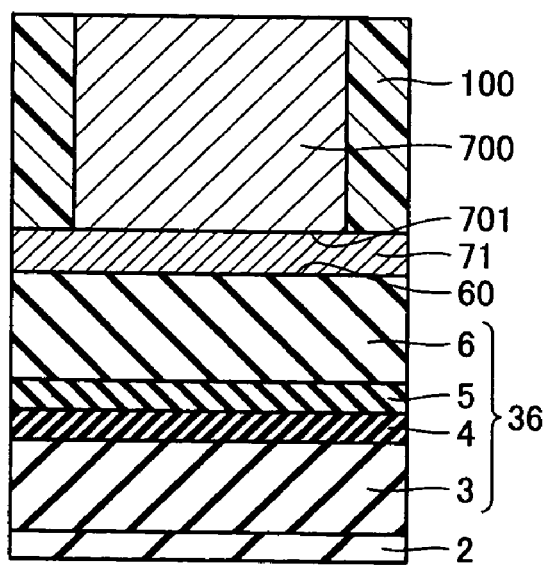

Referring to FIGS. 2 to 8, a method of fabricating a nitride-based compound semiconductor light-emitting device according to the present invention has steps of forming a semiconductor laminate 36 by stacking nitride-based compound semiconductor layers at least partially on a substrate 1 to include an emission layer 4 as shown in FIG. 2, forming a holding electrode 700 partially on a first main surface 60 of the semiconductor laminate 36 opposed to the substrate 1 as shown in FIGS. 3 and 4, and removing the substrate 1 as shown in FIGS. 4 and 5.

In the method of fabricating a nitride-based compound semiconductor light-emitting device according to the present invention, the step of forming the holding electrode 700 partially on the first main surface 60 of the semiconductor laminate 36 opposed to the substrate 1 to be removed in the subsequent step can have steps of forming a resin photomask 100 partially on the main surface 60 and forming the holding electrode 700 in an opening 10 of the resin photomask 100, as shown in FIG. 4. When the resin photomask 100 is employed for forming the holding electrode 700, a photoetching step is so enabled that the holding electrode 700 can be readily partially formed on the main surface 60 of the semiconductor laminate 36.

In the method of fabricating a nitride-based compound semiconductor light-emitting device according to the present invention, the substrate 1 can be formed by an insulating transparent substrate, as shown in FIGS. 2 to 8. When the substrate 1 is formed by an insulating transparent substrate, light emitted from the emission layer 4 is not absorbed even if the substrate 1 partially remains after the step of removing the same. The transparent substrate is not particularly restricted but a sapphire substrate is preferably employed, for example.

In the method of fabricating a nitride-based compound semiconductor light-emitting device according to the present invention, the substrate 1 can include Si or a group III-V compound, as shown in FIGS. 2 to 8. When such a low-priced substrate allowing wet etching is employed, the nitride-based compound semiconductor light-emitting device is so easy to prepare that the fabrication cost can be reduced. The group III-V compound is not particularly restricted but GaAs, GaP, InP, GaAsP or the like is preferably employed.

Embodiments of the present invention are now described with reference to FIGS. 1 to 20. Throughout the specification, the term "nitride-based compound semiconductor" includes $In_xAl_yGa_{1-x-y}N$ ($0 \leq x$, $0 \leq y$, $x+y \leq 1$), for example.

First Embodiment

In a nitride-based compound semiconductor light-emitting device according to a first embodiment of the present invention, a semiconductor laminate 36 including a p-type nitride-based compound semiconductor contact layer 6, a p-type nitride-based compound semiconductor layer 5, an MQW (multiple quantum well) emission layer 4 and an n-type nitride-based compound semiconductor layer 3 and an AlN buffer layer 2 are formed on a holding electrode 700 formed by a p-side selective plating holding electrode and a p-type ohmic electrode 71 while an n-type ohmic electrode 8 is formed on a portion (exposed portion 11 of the n-type nitride-based compound semiconductor layer 3) provided with no AlN buffer layer 2, an n-type pad electrode 9 is formed on the AlN buffer layer 2 and an Au wire 10 is formed on the n-type pad electrode 9, as shown in FIG. 1. The holding electrode 700 is formed to be opposed to a light-emitting surface of the semiconductor laminate 36.

Referring to FIGS. 2 to 8, the nitride-based compound semiconductor light-emitting device according to the first embodiment is fabricated in the following manner: Referring to FIG. 2, a wafer is prepared by successively stacking the AlN buffer layer 2 having a thickness of 200 nm, the n-type nitride-based compound semiconductor layer 3 having a thickness of 500 nm, the MQW emission layer 4 having a thickness of 50 nm, the p-type nitride-based compound semiconductor layer 5 having a thickness of 15 nm and the p-type nitride-based compound semiconductor contact layer 6 having a thickness of 250 nm on a substrate 1 of Si by ordinary MOCVD (metal organic chemical vapor deposition).

Referring to FIG. 3, the aforementioned wafer is taken out from an MOCVD apparatus, for successively forming a Pd layer having a thickness of 50 nm, an Ag layer having a thickness of 150 nm and an Au layer having a thickness of 500 nm on the main surface 60 of the p-type nitride-based compound semiconductor contact layer 6, thereby forming the p-type ohmic electrode 71.

Referring to FIG. 4, a resin photomask 100, including a resin component, provided with an opening 101 having a thickness of 100 μm with an opening length of about 200 μm is formed on the p-type ohmic electrode 71 and thereafter dipped in an electrolytic plating bath for two hours, thereby forming the holding electrode 700 of the p-side selective plating holding electrode of an Ni layer having a thickness of 100 μm only in the opening 101.

Referring to FIGS. 4 and 5, the substrate 1 located oppositely to the holding electrode 700 is removed with a hydrofluoric acid-based etching solution.

Figure 6:
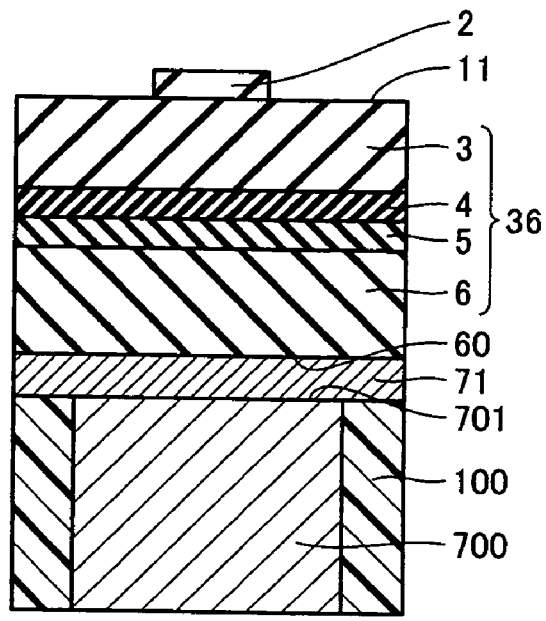

Referring to FIG. 6, the AlN buffer layer 2 is partially etched with chlorine-based gas through RIE (reactive ion etching), one of dry etching methods, for partially exposing the n-type nitride-based compound semiconductor layer 3. The exposed portion 11 of the n-type nitride-based compound semiconductor layer 3, squarely formed as viewed from above according to the first embodiment, may alternatively be formed circularly or in a striped manner.

Figure 7:
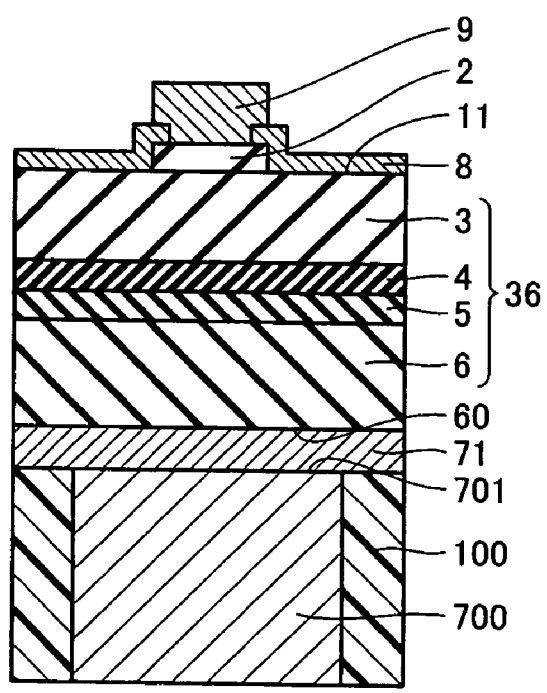

Referring to FIG. 7, the n-type ohmic electrode 8 consisting of an Hf layer having a thickness of 5 nm is formed on the exposed portion 11, while a Pd layer having a thickness of 10 nm and an Au layer having a thickness of 0.5 μm are successively formed on the AlN buffer layer 2 thereby forming the n-type pad electrode 9. Alternatively, the n-type ohmic electrode 8 may be formed by an n-type transparent conductor, so that a Ti layer having a thickness of 10 nm and an Au layer having a thickness of 0.5 μm are formed in contact with the n-type ohmic electrode 8 thereby forming the n-type pad electrode 9.

Sn-added indium oxide ($In_2O_3$:Sn), tin oxide ($SnO_2$), Sb-added tin oxide ($SnO_2$:Sb), F-added tin oxide ($SnO_2$:F), Al-added zinc oxide (ZnO:Al) or Ga-added zinc oxide (ZnO:Ga) is preferably employed as the n-type transparent conductor, forming the n-type ohmic electrode 8, while Sn-added indium oxide is more preferably employed. The content of each additional element in each additional compound is preferably 5 mole % to 10 mole %.

Figure 8:
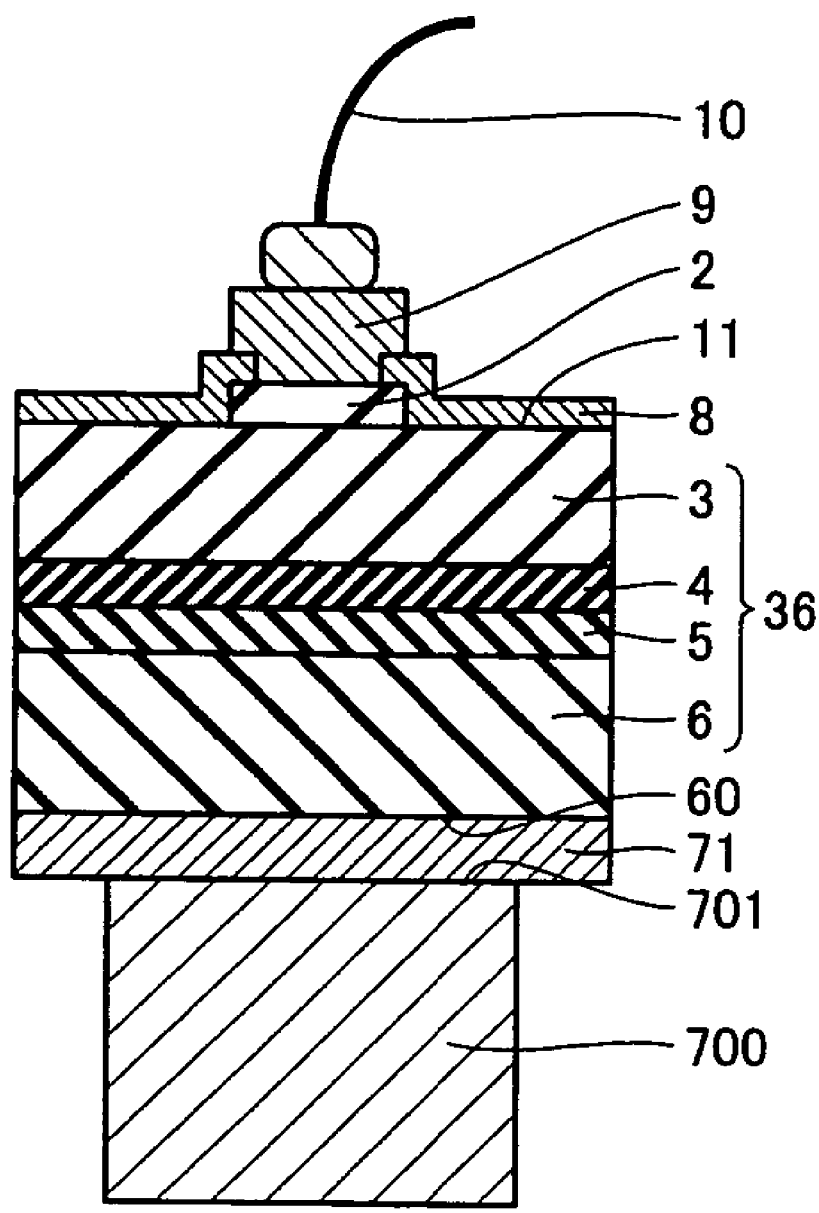

Referring to FIGS. 7 and 8, the resin photomask 100 is removed with an organic solvent. Then, the wafer is divided into each chip of 350 μm square, and the holding electrode 700 is mounted on the bottom of a cup of a lead frame. Thereafter the Au wire 10 is bonded to the n-type pad electrode 9. The AlN buffer layer 2 formed on another main surface of the semiconductor laminate 36 opposite to the main surface 60 formed with the holding electrode 700 functions as a current blocking layer.

A pad electrode formed on an emission surface of a conventional nitride-based compound semiconductor light-emitting device screens light emitted from an emission layer. In the nitride-based compound semiconductor light-emitting device according to the first embodiment, the AlN buffer layer 2, which is an insulation layer, is provided immediately under the n-type pad electrode 9 as a current blocking layer, thereby inhibiting a current from flowing into a region of the emission layer 4 located immediately under the n-type pad electrode 9 and preventing the emission layer 4 from resultless emission, as shown in FIG. 8. In other words, the aforementioned AlN buffer layer 2 is so provided as a current blocking layer that the current flows into the remaining region of the emission layer 4 other than that located immediately under the n-type pad electrode 9 and light emitted in this region is extracted, thereby improving external luminous efficiency. Further, the AlN buffer layer 9 provided immediately under the n-type pad electrode 9 is transparent with respect to light from the emission layer 4. Therefore, light outgoing toward the n-type pad electrode 9 is radiated through the AlN buffer layer 2, whereby the external luminous efficiency is further improved.

According to the first embodiment, a main surface 701 of the p-side selective plating holding electrode forming the holding electrode 700 formed under the semiconductor laminate 36 is provided with an area smaller than that of the main surface 60 of the p-type nitride-based compound semiconductor contact layer 6 so that the holding electrode 700 does not intercept outwardly emitted light, whereby the nitride-based compound semiconductor light-emitting device can attain excellent external luminous efficiency. Further, the holding electrode 700 is formed by partial plating for reducing strain applied to the semiconductor laminate 36 and preventing the wafer from breakage or cracking, whereby the nitride-based compound semiconductor light-emitting device can be improved in reliability. When a layer of an n-type transparent conductor is employed for forming the n-type pad electrode 9 thereon, mechanical damage is reduced in the step of bonding the Au wire 10 to the n-type pad electrode 9, whereby the nitride-based compound semiconductor light-emitting device can be improved in reliability.

Second Embodiment

In a nitride-based compound semiconductor light-emitting device according to a second embodiment of the present invention, a semiconductor laminate 36 including a bent p-type nitride-based compound semiconductor contact layer 6, a bent p-type nitride-based compound semiconductor layer 5, a bent MQW emission layer 4 and an n-type nitride-based compound semiconductor layer 3 is formed on a holding electrode 700 formed by a p-side selective plating holding electrode and p-type ohmic electrodes 71 and 72 while an n-type ohmic electrode 8 is formed on an exposed portion 11 of the n-type nitride-based compound semiconductor layer 3, an n-type pad electrode 9 is formed on the n-type ohmic electrode 8 and an Au wire 10 is formed on the n-type pad electrode 9, as shown in FIG. 9.

Figure 10:
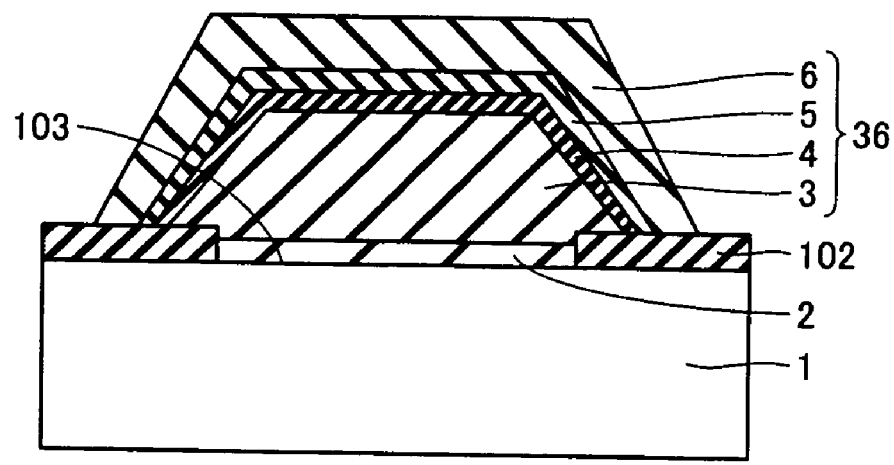
FIGS. 10 to 16 illustrate steps of fabricating the nitride-based compound semiconductor light-emitting device according to the second embodiment of the present invention.

Referring to FIGS. 10 to 16, the nitride-based compound semiconductor light-emitting device according to the second embodiment is fabricated in the following manner: Referring to FIG. 10, a wafer is formed by successively stacking an AlN buffer layer 2 having a thickness of 250 nm, the n-type nitride-based compound semiconductor layer 3 having a thickness of 500 nm, the MQW emission layer 4 having a thickness of 50 nm, the p-type nitride-based compound semiconductor layer 5 having a thickness of 20 nm and the p-type nitride-based compound semiconductor contact layer 6 having a thickness of 200 nm on a substrate 1 of Si partially formed with a selective growth silicon oxide film ($SiO_2$ film) 102 with an opening 103 of 200 μm square by ordinary MOCVD.

Figure 11:
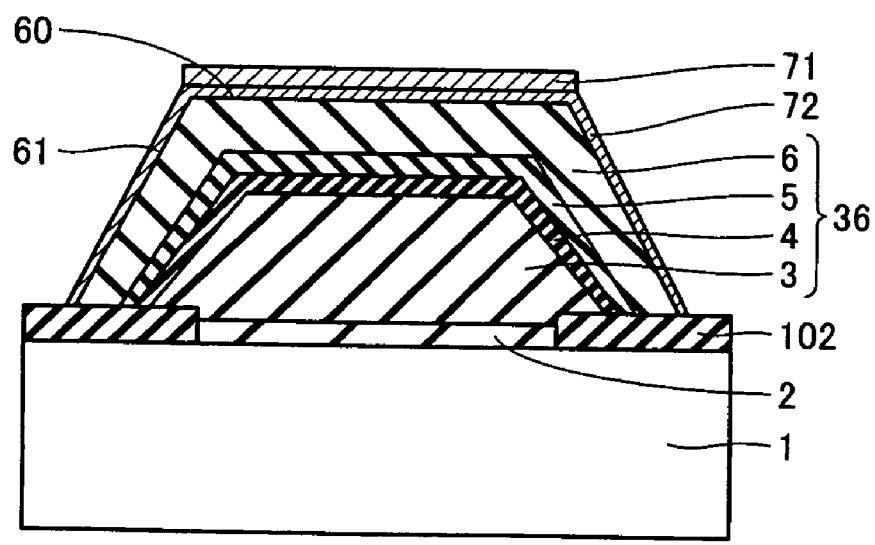

Referring to FIG. 11, the wafer is taken out from an MOCVD apparatus for forming an optically transparent Pd layer having a thickness of 4 nm on a main surface 60 and side surfaces 61 of the p-type nitride-based compound semiconductor contact layer 6 by vapor deposition, thereby forming the p-type ohmic electrode 72. Then, a Pd layer having a thickness of 20 nm, an Ag layer having a thickness of 150 nm and an Au layer having a thickness of 450 nm are successively formed on the main surface 60 of the p-type nitride-based compound semiconductor contact layer 6, thereby forming the p-type ohmic electrode 71.

Figure 12:
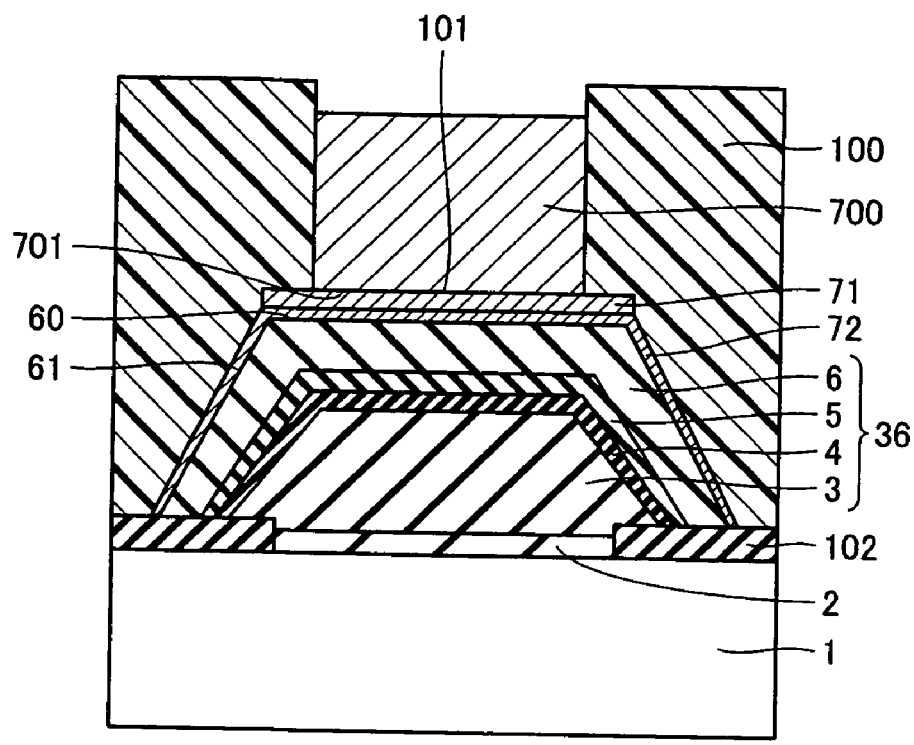

Referring to FIG. 12, a resin photomask 100 provided with an opening 101 having a thickness of 100 μm on the p-type ohmic electrode 71 with an opening length of 200 μm is formed on the p-type ohmic electrodes 71 and 72 and thereafter dipped in an electrolytic plating bath for three hours, thereby forming the holding electrode 700 of the p-side selective plating holding electrode of an Ni layer having a thickness of 80 μm only in the opening 101.

If the thickness of the resin photomask 100 is 100 μm, the thickness of the holding electrode 700 is rendered smaller than 100 μm so that a plating material can be prevented from extruding from the opening 101 of the resin photomask 100. In consideration of this point, the thickness of the holding electrode 700 is set to about 80% of that of the resin photomask 100.

Figure 13:
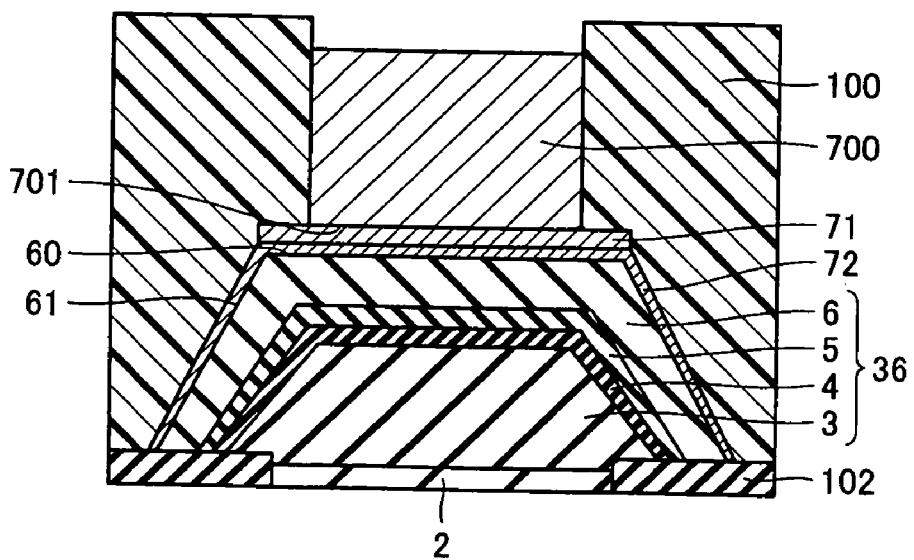

Referring to FIGS. 12 and 13, the substrate 1 located oppositely to the holding electrode 700 is removed with a hydrofluoric acid-based etching solution.

Figure 14:
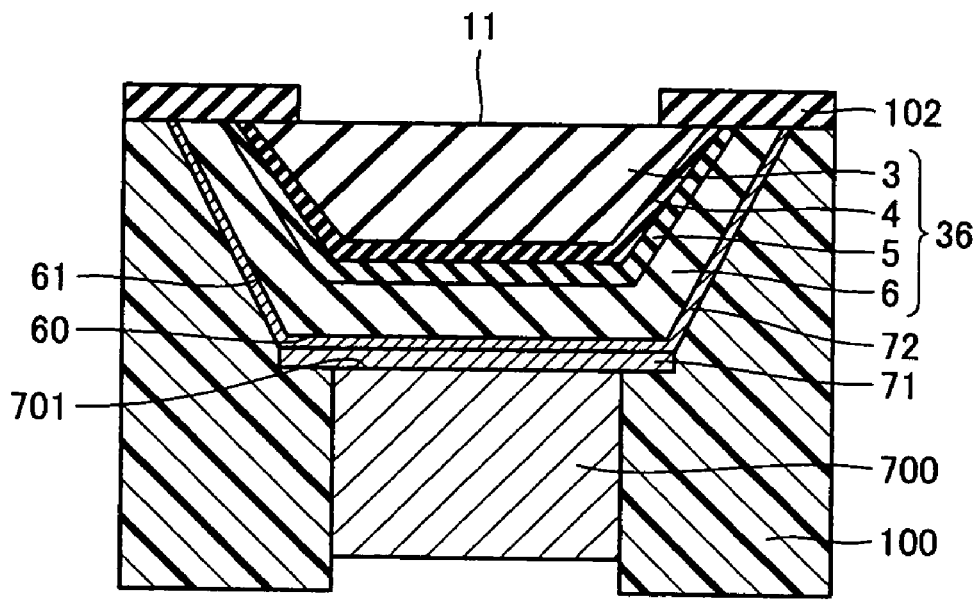

Referring to FIGS. 13 and 14, the AlN buffer layer 2 is etched with a chlorine-based gas through RIE, one of dry etching methods, for exposing the n-type nitride-based compound semiconductor layer 3.

Figure 15:
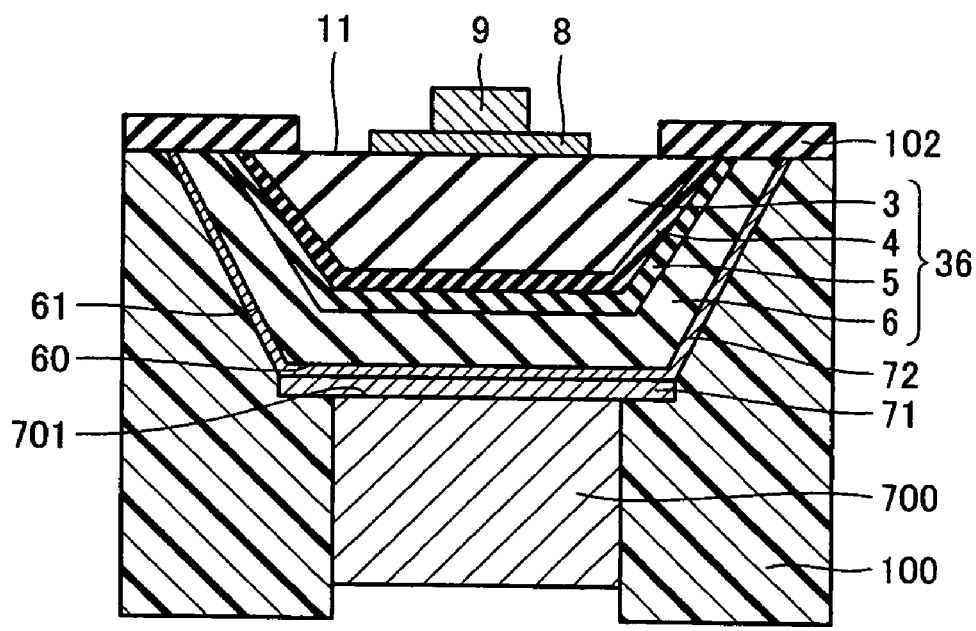

Referring to FIG. 15, an Hf layer having a thickness of 4 nm is formed on the exposed portion 11 of the n-type nitride-based compound semiconductor layer 3 thereby forming the n-type ohmic electrode 8, while an Hf layer having a thickness of 5 nm and an Al layer having a thickness of 0.5 μm are successively formed on the n-type ohmic electrode 8 thereby forming the n-type pad electrode 9.

Figure 16:
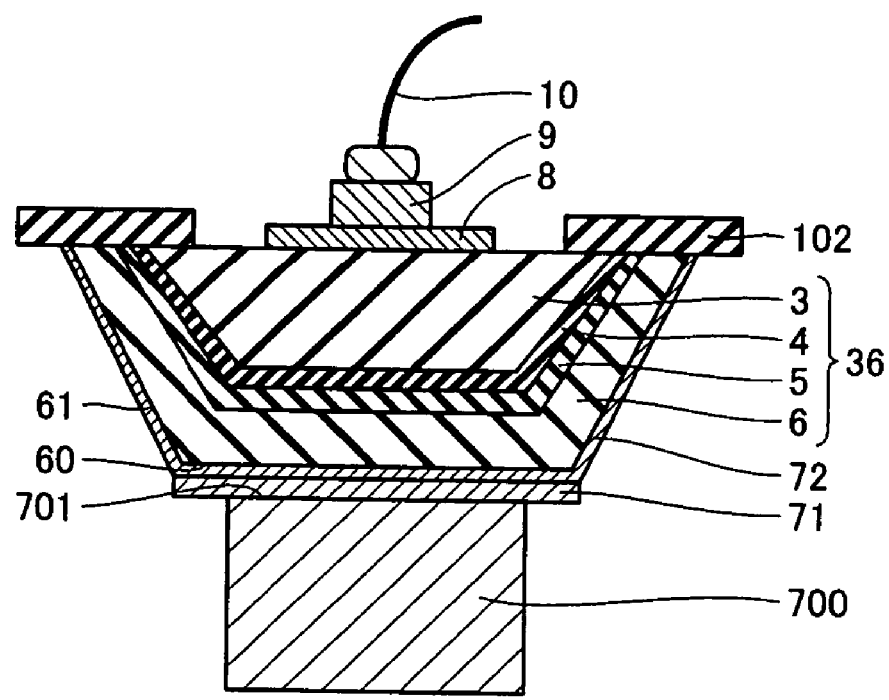

Referring to FIGS. 15 and 16, the resin photomask 100 is removed. The wafer is divided into each chip of 350 μm square, and the holding electrode 700 is mounted on the bottom of a cup of a lead frame. Thereafter the Au wire 10 is bonded to the n-type pad electrode 9.

According to the second embodiment, the holding electrode 700 provided under the semiconductor laminate 36 is formed not on the side surfaces 61 but only on the main surface 60 of the p-type nitride-based compound semiconductor contact layer 6 while the main surface 701 of the holding electrode 700 is provided with an area smaller than that of the main surface 60 of the selectively grown p-type nitride-based compound semiconductor contact layer 6, whereby the holding electrode 700 does not intercept outwardly emitted light but the nitride-based compound semiconductor light-emitting device can be improved in external luminous efficiency. Further, the p-type ohmic electrode 72 having optical transparency is so formed on the side surfaces 61 of the p-type nitride-based compound semiconductor contact layer 6 that a current can be uniformly injected into the p-type nitride-based compound semiconductor contact layer 6.

Third Embodiment

Figure 17:
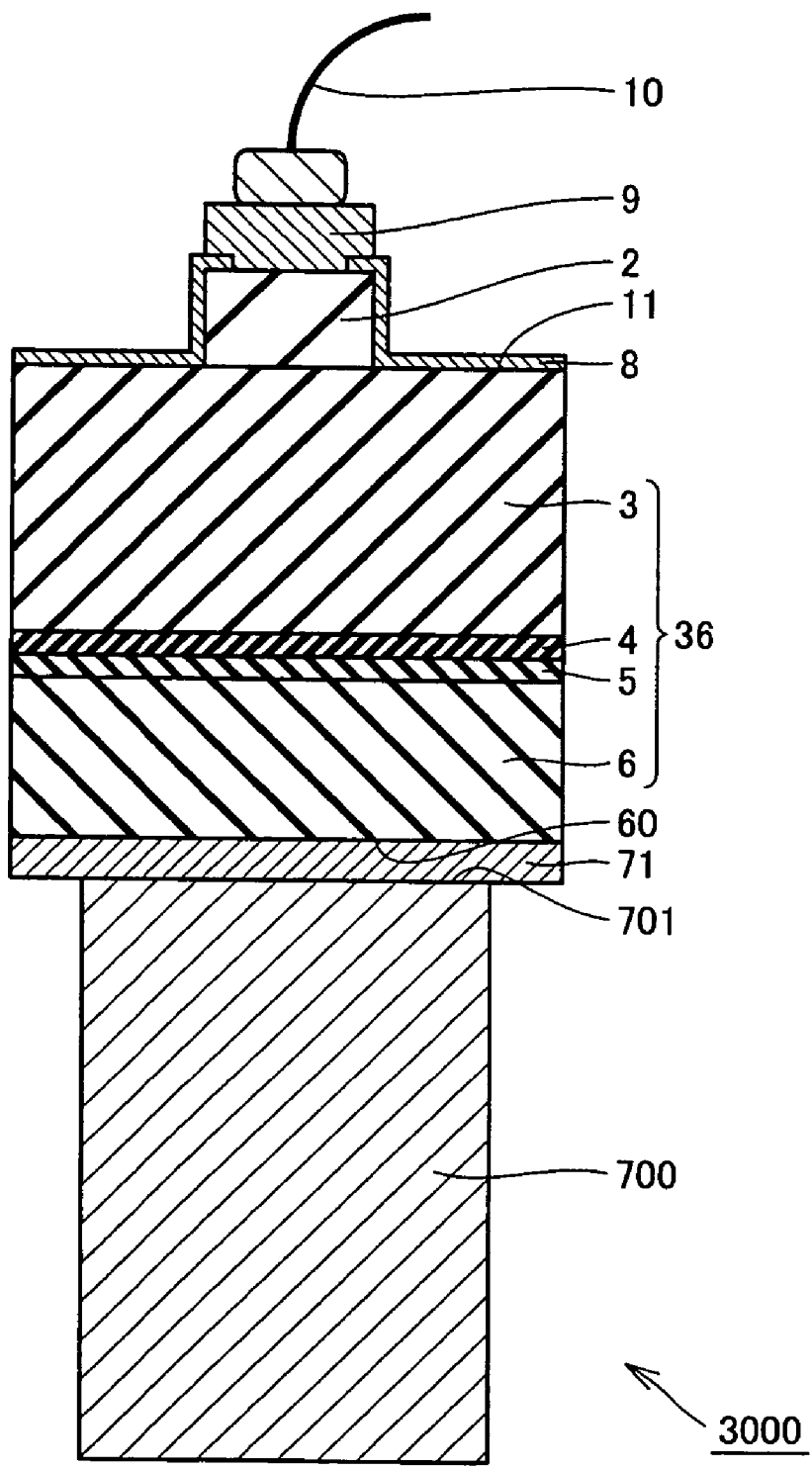
FIG. 17 is a schematic sectional view of a nitride-based compound semiconductor light-emitting device according to a third embodiment of the present invention.

In a nitride-based compound semiconductor light-emitting device according to a third embodiment of the present invention, a semiconductor laminate 36 including a p-type nitride-based compound semiconductor contact layer 6, a p-type nitride-based compound semiconductor layer 5, an MQW emission layer 4 and an n-type nitride-based compound semiconductor layer 3 and an AlN buffer layer 2 are formed on a holding electrode 700 formed by a p-side selective deposition holding electrode and a p-type ohmic electrode 71 while an n-type ohmic electrode 8 is formed on an exposed portion 11 of the n-type nitride-based compound semiconductor layer 3, an n-type pad electrode 9 is formed on the AlN buffer layer 2 and an Au wire 10 is bonded to the n-type pad electrode 9, as shown in FIG. 17. The holding electrode 700 is formed by a transparent conductor, while the p-type ohmic electrode 71 is formed by only a Pd layer having optical transparency.

The nitride-based compound semiconductor light-emitting device according to the third embodiment is fabricated through steps similar to those for fabricating the nitride-based compound semiconductor light-emitting device according to the first embodiment. A method of fabricating the nitride-based compound semiconductor light-emitting device according to the third embodiment is now described with reference to FIGS. 2 to 8.

Referring to FIG. 2, a wafer is prepared by successively stacking the AlN buffer layer 2 having a thickness of 200 nm, the n-type nitride-based compound semiconductor layer 3 having a thickness of 650 nm, the MQW emission layer 4 having a thickness of 45 nm, the p-type nitride-based compound semiconductor layer 5 having a thickness of 25 nm and the p-type nitride-based compound semiconductor contact layer 6 having a thickness of 250 nm on a substrate 1 of Si by ordinary MOCVD.

Referring to FIG. 3, the aforementioned wafer is taken out from an MOCVD apparatus, for forming the Pd layer having a thickness of 3 nm on the main surface 60 of the p-type nitride-based compound semiconductor contact layer 6, thereby forming the p-type ohmic electrode 71.

Referring to FIG. 4, a resin photomask 100 provided with an opening 101 having a thickness of 100 µm with an opening length of 200 µm is formed on the p-type ohmic electrode 71 and an ITO film having a thickness of 80 µm is thereafter formed in the opening 101 by vapor deposition, thereby forming the holding electrode 700. The abbreviation ITO (indium tin oxide) stands for Sn-added indium oxide ($In_2O_3$:Sn). The ITO film may be replaced with Sb- or F-added tin oxide ($SnO_2$:Sb or $SnO_2$:F) or Al- or Ga-added zinc oxide (ZnO:Al or ZnO:Ga)

Referring to FIGS. 4 and 5, the substrate 1 is removed with a hydrofluoric acid-based etching solution.

Referring to FIG. 6, the AlN buffer layer 2 is partially etched with chlorine-based gas through RIE, one of dry etching methods, for partially exposing the n-type nitride-based compound semiconductor layer 3. At this time, the remaining region of the AlN buffer layer 2, i.e., the exposed portion 11 of the n-type nitride-based compound semiconductor layer 3, is set in the form of a square having sides of 90 µm each.

Referring to FIG. 7, an Hf layer having a thickness of 5 nm is formed on the exposed portion 11 of the n-type nitride-based compound semiconductor layer 3 thereby forming the n-type ohmic electrode 8, while an Au layer having a thickness of 1 nm is formed on the AlN buffer layer 2 thereby forming the n-type pad electrode 9.

Referring to FIGS. 7 and 8, the resin photomask 100 is removed with an organic solvent. Then, the wafer is divided into each chip of 350 µm square, and the holding electrode 700 is mounted on the bottom of a cup of a lead frame. Thereafter the Au wire 10 is bonded to the n-type pad electrode 9.

According to the third embodiment, the p-type ohmic electrode 71 is formed only by the Pd layer having optical transparency and the holding electrode 700 is formed by the transparent conductor, whereby light emitted from the MQW emission layer 4 toward the holding electrode 700 is externally radiated from the transparent conductor, so that the nitride-based compound semiconductor light-emitting device can attain excellent external luminous efficiency.

Fourth Embodiment

A nitride-based compound semiconductor light-emitting device according to a fourth embodiment of the present invention has a semiconductor laminate 36 including a p-type nitride-based compound semiconductor contact layer 6, a p-type nitride-based compound semiconductor layer 5, an MQW emission layer 4 and an n-type nitride-based compound semiconductor layer 3 provided on a holding electrode 700 and a p-type ohmic electrode 71 and another semiconductor laminate 37 including another p-type nitride-based compound semiconductor contact layer 6, another p-type nitride-based compound semiconductor layer 4, another MQW emission layer 41 and another n-type nitride-based compound semiconductor layer 3 provided on another holding electrode 770 formed by a p-side selective holding electrode and another p-type ohmic electrode 71, as shown in FIG. 18. N-type ohmic electrodes 8 and n-type pad electrodes 9 are formed on exposed portions 11 of the n-type nitride-based compound semiconductor layers 3, while Au wires 10 are bonded to the n-type pad electrodes 9. According to the fourth embodiment, the MQW emission layers 4 and 41 of the semiconductor laminates 36 and 37 are different in emission area from each other, whereby the nitride-based compound semiconductor light-emitting device can emit light components having different wavelengths from the emission layers 4 and 41.

Fifth Embodiment

In a nitride-based compound semiconductor light-emitting device according to a fifth embodiment of the present invention, a semiconductor laminate 36 including a p-type nitride-based compound semiconductor contact layer 6, a p-type nitride-based compound semiconductor layer 5, an MQW emission layer 4 and an n-type nitride-based compound semiconductor layer 3 and an AlN buffer layer 2 are formed on a p-type ohmic electrode 7 while an n-type ohmic electrode 8 is formed on an exposed portion 11 of the n-type nitride-based compound semiconductor layer 3, an n-type pad electrode 9 is formed on the AlN buffer layer 2 and an Au wire 10 is bonded to the n-type pad electrode 9, as shown in FIG. 19. A holding electrode 700 is formed on another p-type ohmic electrode 71 formed on a first main surface 60 of the semiconductor laminate 36 and partially on side surfaces 61 of the semiconductor laminate 36. Similarly to the third embodiment, the holding electrode 700 is formed by a transparent conductor, and the p-type ohmic electrode 71 is formed by only a Pd layer having optical transparency. In the nitride-based compound semiconductor light-emitting device according to the fifth embodiment, therefore, the holding electrode 700 can be inhibited from intercepting light emitted from the MQW emission layer 4, while the semiconductor laminate 36 and the holding electrode 700 can be improved in mechanical strength.

Sixth Embodiment

In a nitride-based compound semiconductor light-emitting device according to a sixth embodiment of the present invention, a semiconductor laminate 36 including a bent p-type nitride-based compound semiconductor contact layer 6, a bent p-type nitride-based compound semiconductor layer 5, a bent MQW emission layer 4 and an n-type nitride-based compound semiconductor layer 3 is formed on p-type ohmic electrodes 71 and 72 while an n-type ohmic electrode 8 is formed on an exposed portion 11 of the n-type nitride-based compound semiconductor layer 3, an n-type pad electrode 9 is formed on the n-type ohmic electrode 8 and an Au wire 10 is formed on the n-type pad electrode 9, as shown in FIG. 20. A holding electrode 700 is formed on the p-type ohmic electrode 71 provided on a first main surface 60 of the semiconductor laminate 36 and partially on the p-type ohmic electrode 72 provided on side surfaces 61 of the semiconductor laminate 36. The MQW emission layer 4 is so bent as to exhibit a large quantity of light emission from the side surfaces 61 of the semiconductor laminate 36. In the nitride-based compound semiconductor light-emitting device according to the sixth embodiment, therefore, the holding electrode 700 relatively slightly intercepts light emitted from the MQW emission layer 4, while the semiconductor laminate 36 and the holding electrode 700 can be improved in mechanical strength. When the holding electrode 700 is formed by a transparent conductor and the p-type ohmic electrode 71 is formed by only a Pd layer having optical transparency, further, the holding electrode 700 can be further inhibited from intercepting the light emitted from the MQW emission layer 4.

According to the present invention, as hereinabove described, a holding electrode is so partially formed on a first main surface of a semiconductor laminate including nitride-based compound semiconductor layers including an emission layer that it is possible to provide a nitride-based compound semiconductor light-emitting device having high external luminous efficiency with small wafer breakage or cracking and a method of fabricating the same.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride-based compound semiconductor light-emitting device comprising a holding electrode in physical contact with at least part of an area of an ohmic electrode which is in physical contact with a first main surface of a semiconductor laminate of a plurality of nitride-based compound semiconductor layers and including an emission layer, wherein said holding electrode consists of Ni, Cu, Ag, Au, Pd, Al or a laminate of one or more of Ni, Cu, Ag, Au, Pd or Al, said holding electrode provides support to the semiconductor laminate, the area of a main surface of said holding electrode is smaller than the area of said first main surface of said semiconductor laminate, and at least said emission layer has a bent configuration, such that distal edges of the emission layer are bent away from the holding electrode.

2. The nitride-based compound semiconductor light-emitting device according to claim 1, wherein said emission layer of said semiconductor laminate is located on said semiconductor laminate apart from a main surface of said holding electrode facing said semiconductor laminate.

3. The nitride-based compound semiconductor light-emitting device according to claim 1, wherein the thickness of said holding electrode is 10 μm to 300 μm.

4. The nitride-based compound semiconductor light-emitting device according to claim 1, further comprising an AlN buffer layer, an n-type ohmic electrode and an n-type pad electrode successively overlying another main surface of said semiconductor laminate opposite to said main surface adjacent said holding electrode.

5. The nitride-based compound semiconductor light-emitting device according to claim 4, wherein said AlN buffer layer functions as a current blocking layer.

6. The nitride-based compound semiconductor light-emitting device according to claim 1, further comprising an n-type ohmic electrode on another main surface of said semiconductor laminate opposite to said main surface adjacent said holding electrode, and an n-type pad electrode in contact with said n-type ohmic electrode.

7. The nitride-based compound semiconductor light-emitting device according to claim 6, wherein said n-type ohmic electrode includes an n-type transparent conductor.

8. The nitride-based compound semiconductor light-emitting device according to claim 1, wherein said holding electrode is formed by vapor deposition, plating or vapor deposition and plating.

9. The nitride-based compound semiconductor light-emitting device according to claim 8, wherein said holding electrode is formed by vapor deposition, plating or vapor deposition and plating is formed through a resin photomask.

10. The nitride-based compound semiconductor light-emitting device according to claim 1, wherein said emission layer in said semiconductor laminate is located on said semiconductor laminate apart from a main surface of said holding electrode facing said semiconductor laminate.

11. The nitride-based compound semiconductor light-emitting device according to claim 1, wherein said semiconductor laminate includes a p-type nitride-based compound semiconductor contact layer in contact with said ohmic electrode.

* * * * *